(12) United States Patent
Yater et al.

(10) Patent No.: US 9,331,092 B2
(45) Date of Patent: May 3, 2016

(54) METHODS FOR FORMING CONTACT LANDING REGIONS IN SPLIT-GATE NON-VOLATILE MEMORY (NVM) CELL ARRAYS

(71) Applicant: Freescale Semiconductor, Inc., Austin, TX (US)

(72) Inventors: Jane A. Yater, Austin, TX (US); Cheong Min Hong, Austin, TX (US); Sung-Taeg Kang, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/706,130

(22) Filed: May 7, 2015

(65) Prior Publication Data

US 2015/0236035 A1    Aug. 20, 2015

Related U.S. Application Data

(62) Division of application No. 14/022,646, filed on Sep. 10, 2013, now Pat. No. 9,054,208.

(51) Int. Cl.
*H01L 29/788* (2006.01)
*H01L 27/115* (2006.01)
*H01L 29/423* (2006.01)

(52) U.S. Cl.
CPC .... *H01L 27/11568* (2013.01); *H01L 27/11565* (2013.01); *H01L 29/42344* (2013.01)

(58) Field of Classification Search
CPC ............ H01L 27/115; H01L 27/11521; H01L 21/28272; H01L 29/42324; H01L 29/66825
USPC ......................................... 257/316, 318, 320
See application file for complete search history.

(56) References Cited

U.S. PATENT DOCUMENTS

| 6,861,698 | B2 | 3/2005 | Wang |
| 7,227,217 | B2 | 6/2007 | Levi et al. |
| 7,936,611 | B2 * | 5/2011 | Lee ................... H01L 27/11568 365/185.24 |
| 2009/0309153 | A1 | 12/2009 | Yanagi et al. |
| 2012/0068264 | A1 | 3/2012 | Cheng et al. |
| 2015/0069490 | A1 | 3/2015 | Yater et al. |

* cited by examiner

*Primary Examiner* — Quoc Hoang

(57) ABSTRACT

Methods and related structures are disclosed for forming contact landing regions in split-gate NVM (non-volatile memory) systems. A dummy select gate structure is formed while also forming select gates for split-gate NVM cells. A control gate layer is formed over the select gates and the dummy select gate structure, as well as an intervening charge storage layer. The control gate material will fill in gaps between the select gate material and the dummy select gate material. A non-patterned spacer etch is then used to etch the control gate layer to form a contact landing region associated with the dummy select gate structure while also forming spacer control gates for the split-gate NVM cells. The disclosed embodiments provide improved (e.g., more planar) contact landing regions without requiring additional processing steps and without increasing the pitch of the resulting NVM cell array.

11 Claims, 8 Drawing Sheets

US 9,331,092 B2

METHODS FOR FORMING CONTACT LANDING REGIONS IN SPLIT-GATE NON-VOLATILE MEMORY (NVM) CELL ARRAYS

RELATED APPLICATIONS

This application is a divisional application of U.S. patent application Ser. No. 14/022,646, filed Sep. 10, 2013, and entitled "METHODS FOR FORMING CONTACT LANDING REGIONS IN SPLIT-GATE NON-VOLATILE MEMORY (NVM) CELL ARRAYS," which is hereby incorporated by reference in its entirety.

TECHNICAL FIELD

This technical field relates to non-volatile memory (NVM) systems and, more particularly, to forming landing regions for electrical contacts within arrays of split-gate NVM cells.

BACKGROUND

Non-volatile memory (NVM) systems having arrays of NVM cells are used in a variety of electronic systems and devices. As cell geometries continue to be scaled to smaller and smaller sizes, good quality electrical contacts within these arrays of NVM cells become more difficult to form. Further, for split-gate NVM cells, processing steps can cause further difficulties in forming electrical contacts.

DESCRIPTION OF THE DRAWINGS

It is noted that the appended figures illustrate only example embodiments and are, therefore, not to be considered as limiting the scope of the present invention. Elements in the figures are illustrated for simplicity and clarity and have not necessarily been drawn to scale.

DETAILED DESCRIPTION

Methods and related structures are disclosed for forming improved contact landing regions in split-gate NVM (non-volatile memory) cell arrays. A dummy select gate structure is formed while also forming select gate structures for split-gate NVM cells. A control gate layer is formed over the select gate structures and the dummy select gate structure, as well as an intervening charge storage layer. The control gate material will fill in gaps between the select gate material and the dummy select gate material. A non-patterned spacer etch is then used to etch the control gate layer to form a contact landing region associated with the dummy select gate structure while also forming spacer control gate structures for the split-gate NVM cells. The contact landing regions can be used for making electrical connections within the resulting split-gate NVM cell array. Advantageously, the embodiments described herein provide improved (e.g., more planar) contact landing regions without requiring additional processing steps and without increasing the pitch of the resulting NVM cell array. Different features and variations can be implemented, as desired, and related or modified systems and methods can be utilized, as well.

Processing steps for split-gate NVM cells can leave non-planar surfaces that cause difficulties in later making good quality electrical connections. For example, if control gates for split-gate NVM cells were formed using a non-patterned spacer gate etch processing step, well-defined lithographic contact landing areas associated with the control gate structures would not be readily available without additional masking steps that increase costs and processing time.

Figure 1:
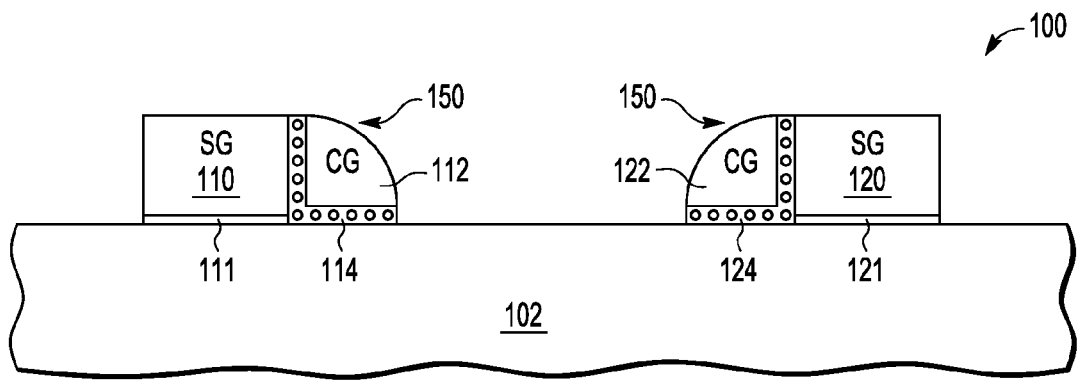
FIG. 1 is a cross-section view of an embodiment for select gate and control gate structures for a split-gate non-volatile memory (NVM) cell array where a non-patterned spacer gate etch has been used to form control gate structures.

FIG. 1 is a cross-section view of an embodiment 100 for select gate and control gate structures for a split-gate non-volatile memory (NVM) cell array where a non-patterned spacer gate etch has been used to form control gate structures 112/122. As shown, one split-gate NVM structure includes select gate (SG) structure 110, select-gate dielectric (e.g., oxide) layer 111, charge storage layer 114, and control gate (CG) structure 112 that are each formed over substrate 102. Another split-gate NVM cell structure includes select gate (SG) structure 120, select-gate dielectric (e.g., oxide) layer 121 charge storage layer 124, and control gate (CG) structure 122 that are each formed over substrate 102. Electrical contacts made to select gate structures 110/120 will tend to be good quality electrical connections as select gate structures 110/120 are well-defined structures (e.g., formed using mask layers). In contrast, because control gate structures 112/122 were formed using a non-patterned spacer etch processing step without mask layers, control gate structure 112/122 are left with non-planar curved surfaces as shown by arrows 150. The area available for contact landing is determined by the spacer control gate length without the ability to be adjusted to meet design rules. As such, the electrical contacts made to control gate structures 112/122 will tend to form poor quality electrical connections, for example, if alignment is not exact or if gate length is too short.

The embodiments described herein provide improved contact landing regions in split-gate NVM (non-volatile memory) cell arrays. Dummy select gate structures are formed at the same time as other select gate structures to allow subsequent control gate layers to form improved landing regions to which electrical contacts can be made in later processing steps. As described in more detail below, for one example embodiment, a dummy select gate structure is added between select gate lines to provide a sidewall for formation of a control-gate strap and an associated contact landing region without an added mask. The control gate material fills in the areas between the select gate structures and the dummy select gate structure, and sufficient control gate material remains after a non-patterned spacer etch to create the control-gate strap connection and the contact landing region for a control gate contact. In another example embodiment, dummy select gate material is located at the longitudinal end of the NVM cell array to provide a sidewall for formation of a wrap connection between two control-gate lines and an associated contact landing region. The control gate material fills in areas between the end of two select gate lines and the dummy select gate structures, and sufficient control gate material remains after a non-patterned spacer etch to form the control-gate wrap connection and the contact landing region for end cell contact. For both the strap and end wrap embodiments, the dummy select gate structures are located on field oxide and are not electrically contacted. It is further noted that the dummy select gate structures described herein are non-active additional structures that are formed using the processing steps that are used to form select gate structures for active split-gate cells within the split-gate NVM cell array. Variations and additional embodiments can also be implemented, as desired.

Figure 3:
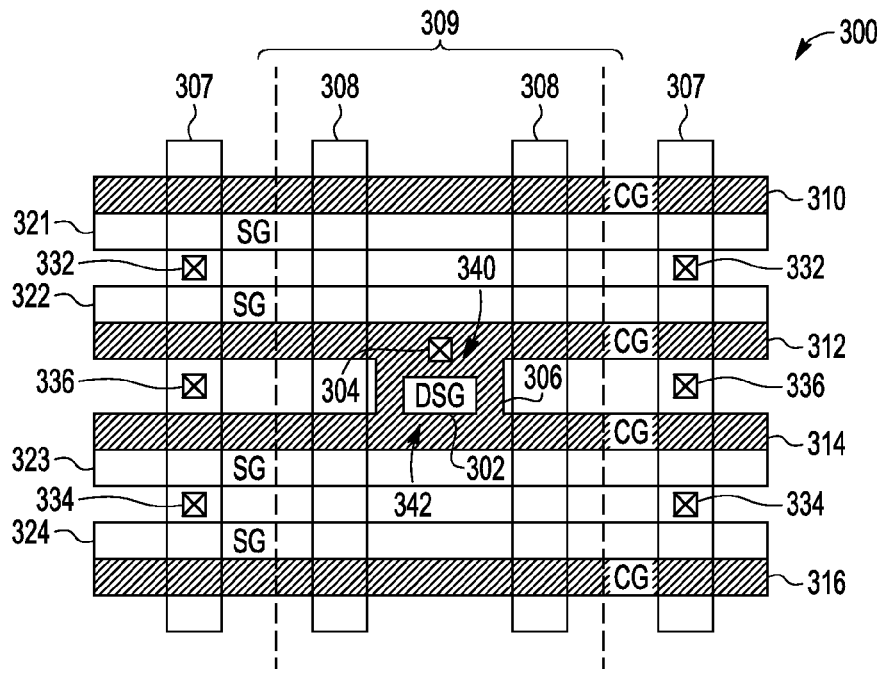
FIG. 3 is an example embodiment of a top view for a control-gate strap and an associated contact landing region using a dummy select gate structure and a non-patterned spacer gate etch.
Figure 4:
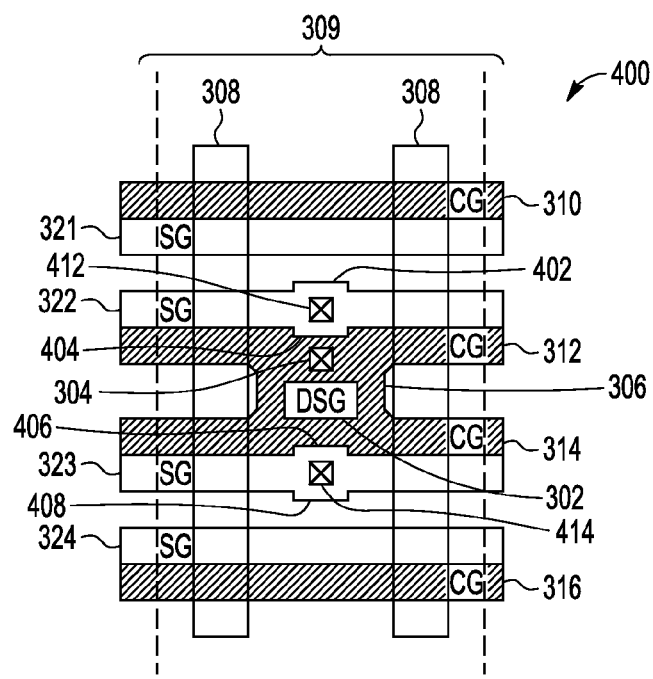
FIG. 4 is a further example embodiment where select gate tabs are used to expand select gate landing regions associated with a strap connection.
Figure 5A:
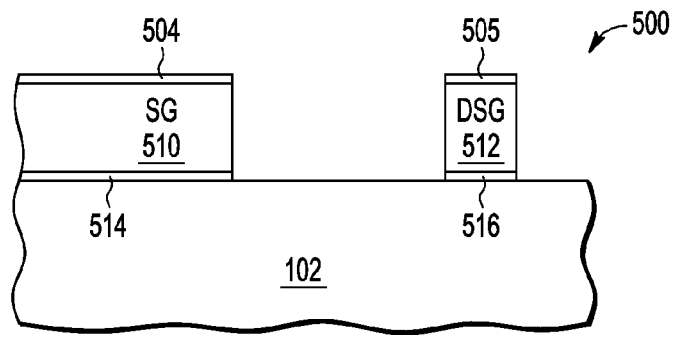
FIGS. 5A-C are example embodiments of cross-section views for formation of an end cell control-gate wrap connection and an associated contact landing region adjacent two select gate lines using a dummy select gate structure and a non-patterned spacer gate etch.
Figure 5B:
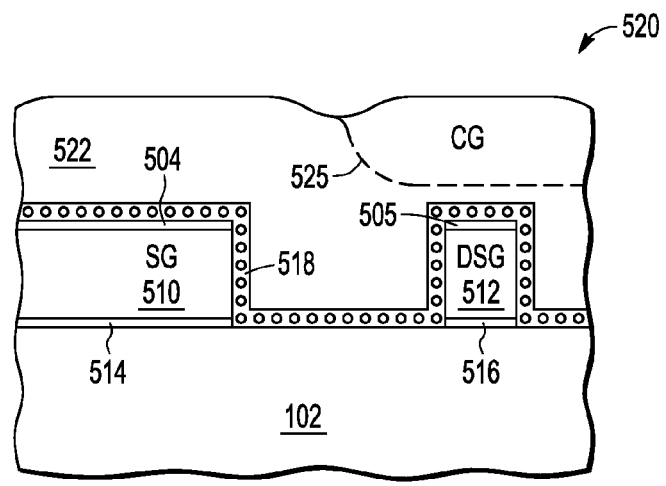
Figure 5C:
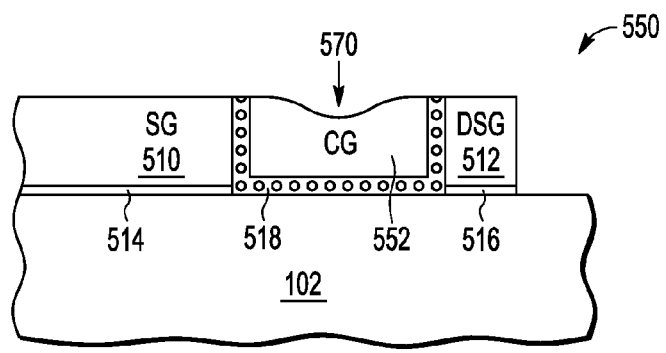
Figure 6A:
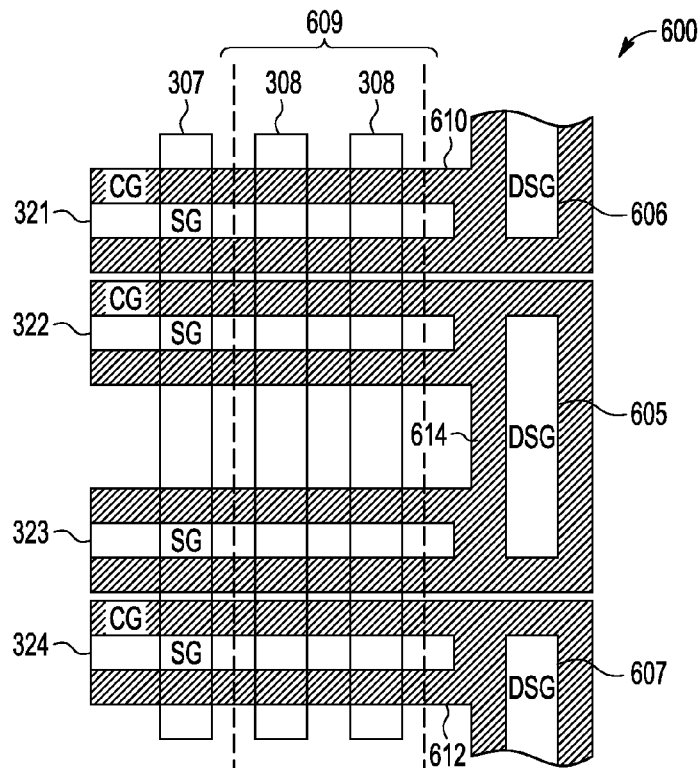
FIGS. 6A-B are example embodiments of top views for an end cell wrap connection and an associated contact landing region adjacent two select gate lines using a dummy select gate structure and a non-patterned spacer gate etch.
Figure 6B:
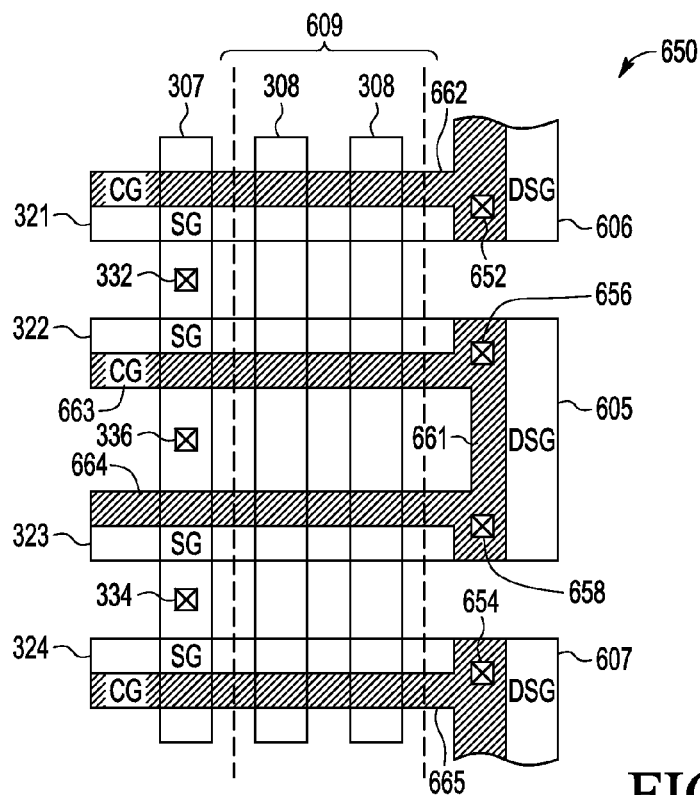
Figure 7:
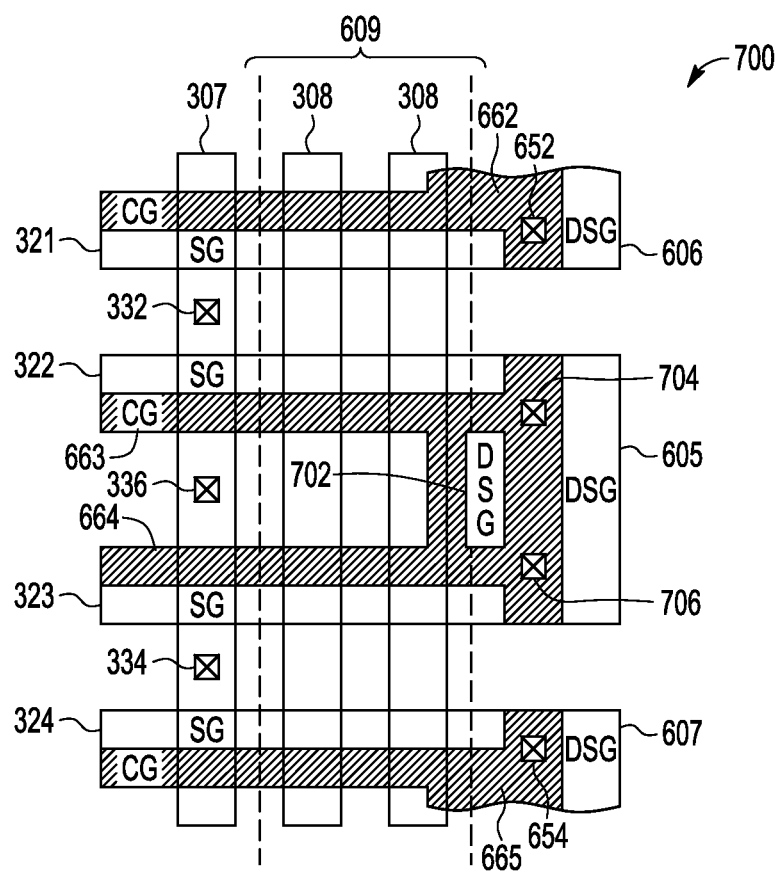
FIG. 7 is a further example embodiment where an additional dummy select gate structure is used to form larger contact landing regions associated with the wrap connection.
Figure 8:
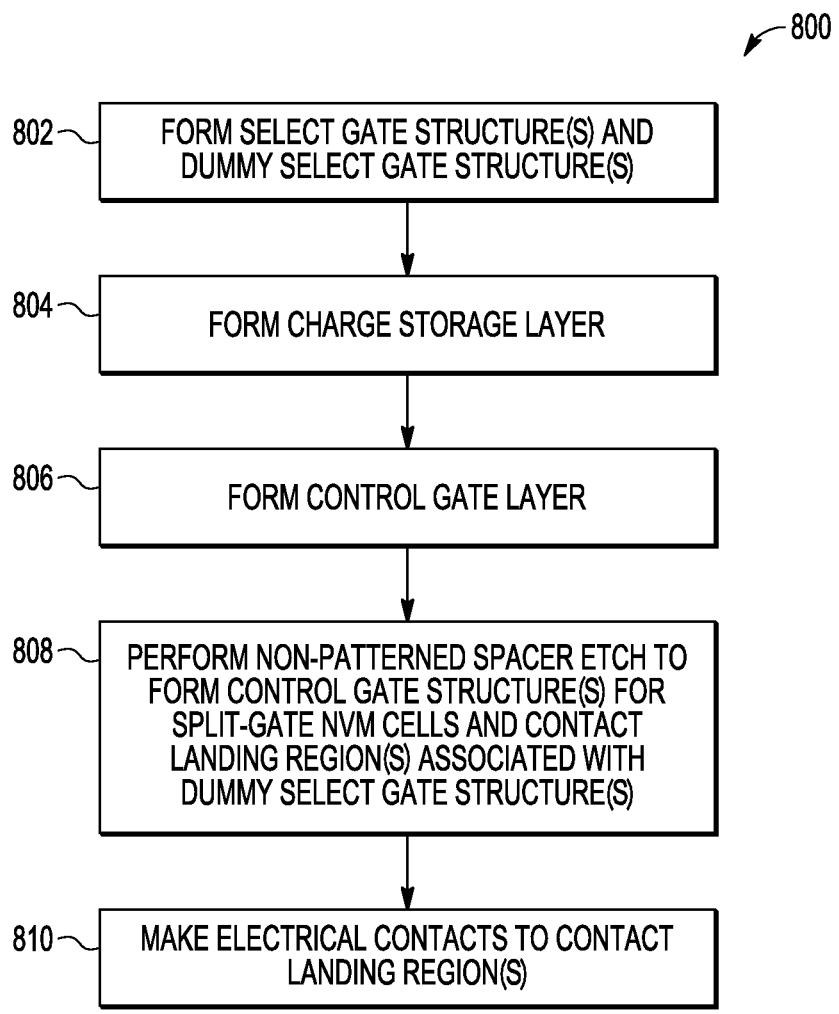
FIG. 8 provides an example process flow diagram for using dummy select gate structures and a non-patterned spacer gate etch to form improved contact landing regions.
Figure 9:
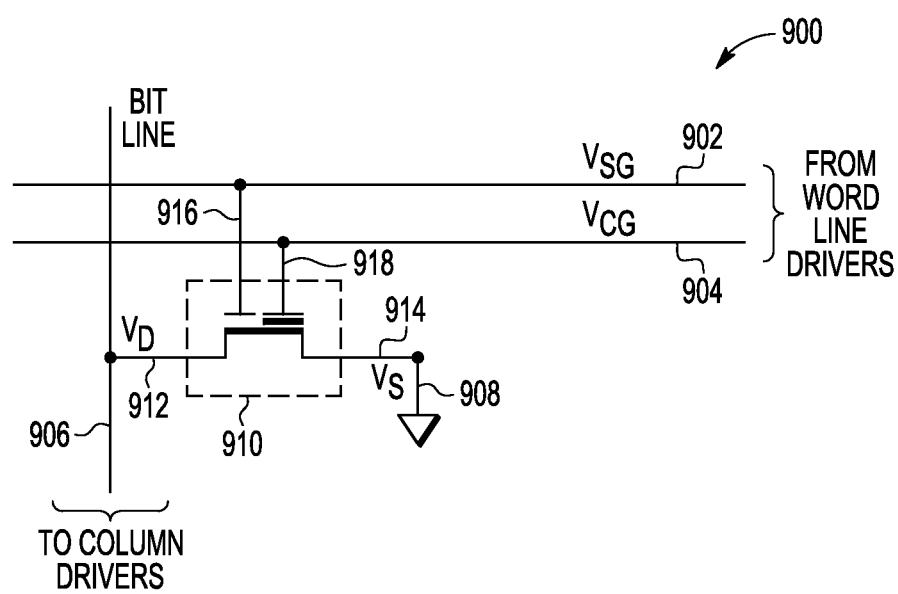
FIG. 9 is a diagram of an embodiment for wordline driver and column driver connections associated with a split-gate NVM cell.

Example embodiments will be described in more detail below with respect to the drawings. FIGS. 2A-E provide example cross-section views for formation of a control-gate strap and associated contact landing region between two select gate structures using a dummy select gate structure. FIG. 3 provides an example top view for formation of the control-gate strap and associated contact landing region. FIG. 4 provides a top view for a further example where tabs are used to expand the select gate landing region. FIGS. 5A-C provide example cross-section views for formation of the control gate wrap connection and associated contact landing region using a dummy select gate structure. FIGS. 6A-B provide an example top view for formation of the end cell wrap connection and associated contact landing region. FIG. 7 provides a top view for a further example where additional dummy select gate material is used to form larger contact regions associated with the wrap connection. FIG. 8 provides an example process flow embodiment. FIG. 9 provides example connections to a split-gate NVM cell. It is further noted that the drawings provide representative embodiment and are not necessarily drawn to exact scale.

Looking to FIGS. 2A-E, example cross-section views are shown for formation of a control-gate strap and associated contact landing region between two select gate lines.

Figure 2A:
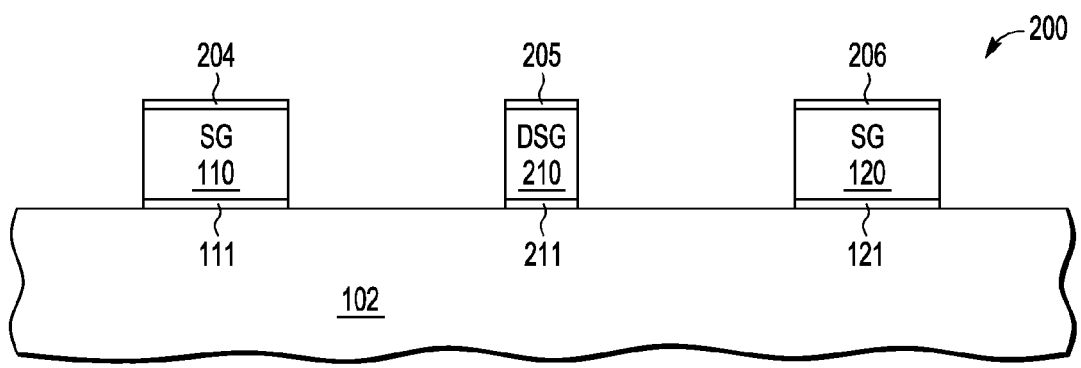
FIGS. 2A-E are example embodiments of cross-section views for formation of a control-gate strap and associated contact landing regions using a dummy select gate structure and a non-patterned spacer gate etch.

FIG. 2A is a cross-section view of an embodiment 200 after a select gate processing step. As depicted, select gate (SG) structure 110 for one select gate line and select gate (SG) structure 120 for another select gate line have been formed over substrate 102, along with intervening dielectric layers 111 and 121. Using the same select gate processing step, a dummy select gate (DSG) structure 210 and a dielectric layer 211 have also been formed while the select structures 110/120 and dielectric layers 111/121 were being formed. As such, the dummy select gate structure 210 is formed using the same material and processing steps as used to form the select structures 110/120. Further, as shown for embodiment 200, a protective dielectric layer was formed over the select gate layer prior to etching of the select gate layer to form select structures 110/120 and dummy select gate structure 210. As such, protective layers 204, 205, and 206 remain for embodiment 200, and these protective layers 204, 205, and 206 act as optical patterning layers and hard mask for future etches.

It is noted that the select structures 110/120 can be formed using doped polysilicon or other conductive material, as desired. Further, this select gate material can be deposited, patterned, and etched to form well-defined structures, if desired. Different and/or additional processing steps could also be utilized if desired. It is also noted that the dielectric layers 111, 121, and 211 can be, for example, an oxide layer. The protective layers 204, 205, and 206 can be, for example, a nitride layer. In addition, it is noted that for 90 nanometer (nm) processing technology, the protective nitride layer can be about 10-30 nm; the select gate and dummy select gate polysilicon layers can be about 100-200 nm, and the oxide dielectric layer can be about 2-5 nm. It is further noted that the semiconductor substrate 102 described herein can be any desired semiconductor material or combinations of materials, such as gallium arsenide, silicon germanium, silicon, monocrystalline silicon, other semiconductor materials, and combinations of these semiconductor materials. It is also noted that the semiconductor substrate 102 represents the top portion of a semiconductor substrate. It is further noted that the semiconductor substrate 102 described herein could be formed on top of other substrate materials including a separate non-semiconductor material, if desired, such as thin film semiconductor substrates formed on other semiconductor or non-semiconductor materials. Further variations could also be implemented, as desired.

Figure 2B:
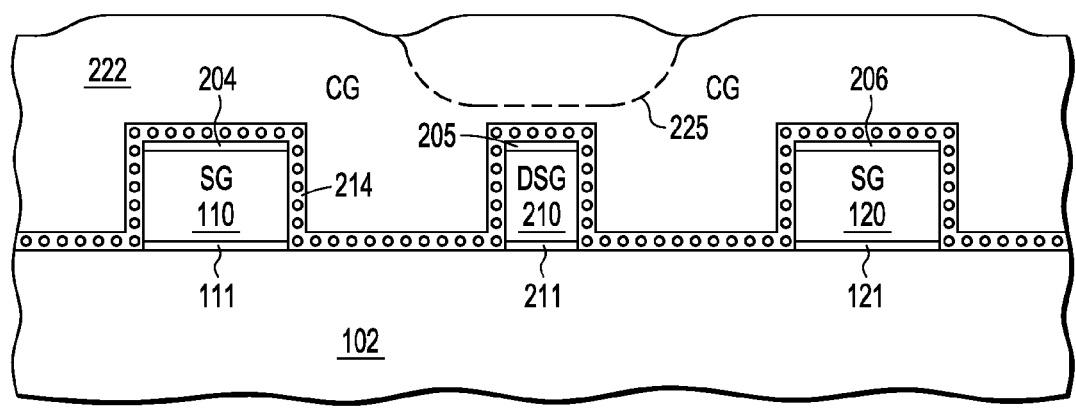

FIG. 2B is a cross-section view of an embodiment 220 after a control gate layer has been formed. As depicted, an intervening charge storage layer 214 has previously been formed over the select structures 110/120. The control gate layer 222 is then formed over the select structures 110/120 and charge storage layer 214. As also seen with respect to embodiment 220, placement of the dummy select gate structure 210 relatively close to the select structures 110/120 causes the control gate material to cover the dummy select gate structure 210 and to fill in the areas between the dummy select gate structure 210 and the select structures 110/120. Without the dummy select gate structure 210, the control gate material would drop much closer to the substrate 102 as indicated by dashed line 225. It is noted that the spacing of the dummy select gate structure 210 from the select structures 110/120 is dependent on the select gate and control gate material thicknesses. As one example, the distance from the edges of the dummy select gate structure 210 to the select structures 110/120, respectively, can be made to be equal to or less than about 1.5-2.0 times the thickness of the control gate layer. Further, it is noted that the select structures 110/120 can be spaced apart by about 4-5 times the thickness of the control gate layer. Other variations and dimensions could also be utilized, as desired, while still allowing the control gate material to fill in the gaps between select-gate structures and dummy select-gate structures.

It is noted that the control gate material 222 can be formed using doped polysilicon or other conductive material, as desired. Further, for 90 nanometer (nm) processing technology, the control gate polysilicon layer can be about 100-200 nm. Further, this control gate material can be deposited and then etched using a non-patterned spacer gate etch. As described herein, the non-patterned spacer etch does not utilize prior patterning masks for the control gate layer, and the resulting spacer gate structures will not have well-defined vertical edges. Different and/or additional processing steps or variations could also be used with respect to formation of the control gate layer, as desired.

It is further noted that the charge storage layer 214 can be formed, for example, using silicon nanocrystals, metal nanoclusters, nitride or some other desired discrete charge storage material that is electrically insulated from the top and bottom gates such as by embedding in a dielectric such as oxide. For example, to form a nanocrystal charge storage layer, an oxide layer can first be grown followed by formation of a layer of nanocrystals. An additional oxide layer can then be formed on top of the nanocrystal layer thereby resulting in nanocrystals embedded between oxide layers. However, because the initial oxide will not grow on the nitride layers 204, 205, and 206, the portions of the charge storage layer 214 that are above these nitride layers will have nanocrystals on top of the nitride layers with a top oxide layer and no initial oxide layer. Other variations could also be used, if desired.

Figure 2C:
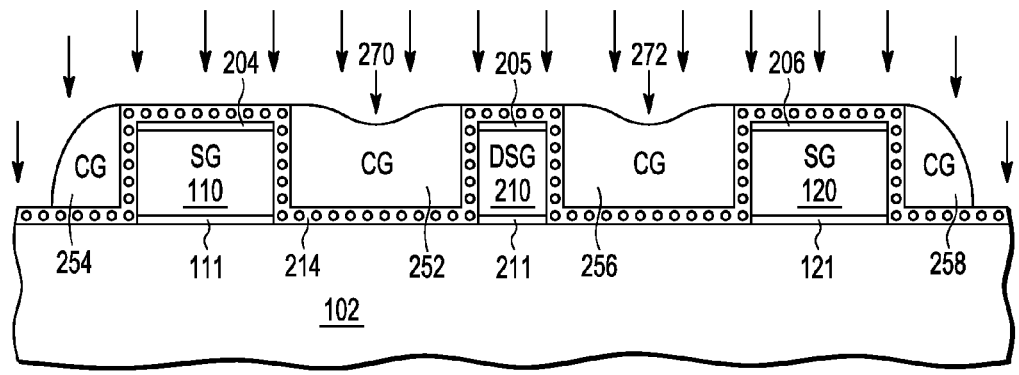

FIG. 2C is a cross-section view of an embodiment 250 after a non-patterned spacer etch has been used to etch the control gate layer 222. During this process, the control gate layer 222 is etched to form a control-gate strap between two select gate structures including control gate regions 252 and 256. As depicted, control gate region 252 has been formed with respect to select gate structure 110, and the material for the control gate region 252 extends to the dummy select gate structure 210. Similarly, control gate region 256 has been formed with respect to select gate structure 120, and the material for the control gate region 256 extends to the dummy select gate structure 210. As also depicted, parasitic (or redundant) spacer control gate regions 254 and 258 also remain after the non-patterned spacer etch has been applied to the control gate layer 222. Advantageously, unlike the spacer control structures 112/122 in embodiment 100 for FIG. 1 (Prior Art), improved contact landing regions (e.g., more planar), as represented by arrows 270 and 272, are formed by the control gate material 252/256 that extends between the select gate structures 110/120 and the dummy select gate structure 210. As such, electrical contacts will have better electrical connections due to the improved contact landing regions 270/272 that provide a more planar contact surface.

Figure 2D:
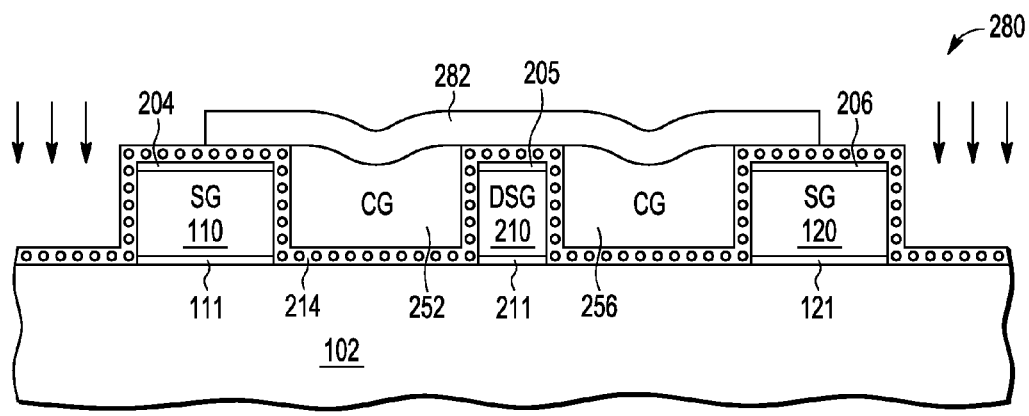

FIG. 2D is a cross-section view of an embodiment 280 of a patterning and etching step that is utilized to remove the parasitic (or redundant) spacer gate regions 254 and 258. As shown, a protective layer 282 (e.g., photoresist) is formed and patterned to protect covered regions from the etch processing step. As indicated by the arrows, an etch processing step is then utilized to remove the parasitic (or redundant) spacer control gate regions 254 and 258. It is noted that the parasitic (or redundant) spacer control gate regions 254 and 258 could be left within the resulting NVM cell array, if desired.

Figure 2E:
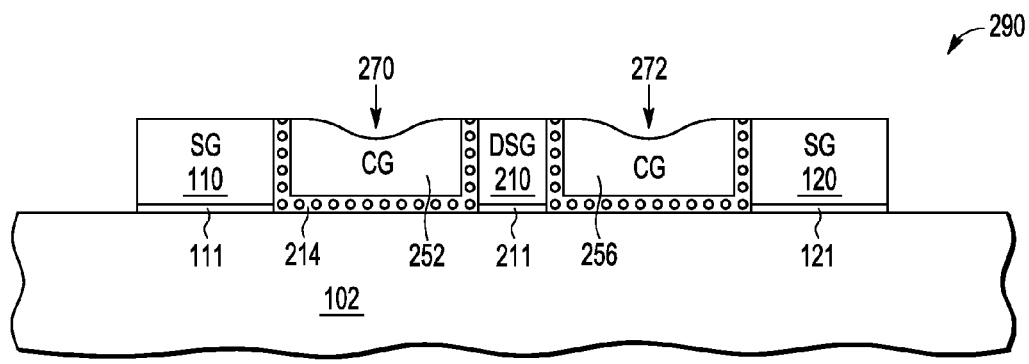

FIG. 2E is a cross-section view of an embodiment 290 after further processing with respect to the strap connection between select gate structures 110/120 formed by control gate regions 252/256 and dummy select gate structure 210. As depicted, the protective layer 282, the nitride layers 204/205/206, and portions of the charge storage layer 214 have been removed. Alternatively, the nitride layers 204/205/206 and portions of the charge storage layer 214 under the protective layer 282 in FIG. 2D can be retained, if desired, by removing layer 282 after further processing steps have been used to remove the charge storage layer and nitride layers in the unprotected regions. In later processing steps, electrical contacts can be made to the contact landing regions 270/272 provided by the control gate regions 252/256. As indicated above, these electrical contacts will have better electrical connections due to the improved contact landing regions 270/272 that provide a more planar contact surface for the electrical contacts.

Now looking to FIGS. 3-4, further embodiments are provided that show a top view for formation of a control-gate strap and associated contact landing regions and that show a top view for using select-gate tabs to expand select gate landing regions, respectively. It is again noted that these top view diagrams provide representative embodiments of only a portion of an NVM cell array and are not necessarily drawn to exact scale.

FIG. 3 is a top view diagram of an embodiment 300 after a non-patterned spacer gate etch and after patterned etch removal of parasitic control gates. In particular, the non-patterned spacer gate etch has left control gate strap region 306 and control gate lines 310, 312, 314, and 316. The patterned parasitic etch has removed parasitic control gates in the drain region between select gate lines 321 and 322 and the drain region between select gate lines 323 and 324. It is noted that active lines 307 represent two of numerous areas of the resulting NVM cell array where active split-gate cells will be formed using the select gate lines 321, 322, 323, and 324. In contrast, the strap region 309 includes dummy active lines 308 that will not include active split-gate cells. As depicted, dummy select gate (DSG) structure 302 acts to expand the control gate material so that a control-gate strap region 306 between control gate line 312 and control gate line 314 is left after the non-patterned spacer etch. As described herein, this control-gate strap region 306 formed using the dummy select structure 302 also provides improved contact landing regions 340 and 342, as described herein. For example, location 304 represents a location within the improved contact landing region 340 where a contact can be placed in later processing steps to form a connection to the control-gate strap region 306. Locations 332 and 334 represent locations where drain contacts can be placed in later processing steps to form connections to drain regions formed between select gate lines 321/322 and 323/324, respectively. Locations 336 represents locations where source contacts can be placed in later processing steps to form connections to source regions formed between control gate lines 312/314. Further, as noted above for one example embodiment, the select gate lines 322 and 323 can be spaced apart by about 4-5 times the thickness of the control gate layer, and the distance from the edges of the dummy select gate structure 302 to the select gate lines 322/323, respectively, can be made to be equal to or less than about 1.5-2.0 times the thickness of the control gate layer. Further, it is noted that the select gate lines 321 and 322, as well as select gate lines 323 and 324, can be spaced apart by about 2-3 times the thickness of the control gate layer. Other variations and dimensions could also be utilized, as desired.

FIG. 4 is a top view diagram of an embodiment 400 where additional dummy select gate material is used to form tabs that provide for larger contact landing areas for select gates. As depicted, additional select gate tabs 402 and 404 have been used to expand the select gate line 322 in a region where an electrical contact may be made as represented by location 412. Similarly, additional select gate tabs 406 and 408 have been used to expand the select gate line 323 in a region where an electrical contact may be made as represented by location 414. The control-gate strap region 306 will also expand around the select gate tabs 404 and 406, as shown. In addition, location 304 represents a possible location for later placement of an electrical contact to the control-gate strap region 306.

The improved contact landing regions described herein are formed at the same time that select gate structures and control gate structures are formed for active split-gate NVM cells (not shown) within the active lines 307 for the NVM cell array. With respect to these active split-gate NVM cells, subsequent processing steps can be used to complete the split-gate NVM cells within the active lines 307. For example, after control gate structures and select gate structures are patterned and etched to form desired structures within the active lines 307 (at which time the improved landing regions are also formed using the dummy select gate structures described herein), source/drain implants can be used to form source regions and drain regions for the active split-gate NVM cells within the active lines 307. Further, one or more subsequent processing steps can be utilized to place electrical contacts in desired locations and to form desired interconnections for the NVM array. For example, interconnect layers can be formed using one or more metal layers, doped polysilicon layers, and/or other desired conductive material layers that are formed, patterned, and etched to create desired interconnect layers.

With respect to forming electrical contacts, such as to locations 304 and 412/414 as shown in FIGS. 3-4, it is noted that processing steps to form the contacts at these locations can include forming a protective layer over the underlying structures including the improved landing regions, forming vias through the protective layer where contacts to the improved landing regions are desired, forming a conductive layer over the protective layer that also fills the vias to provide a contact to the improved landing regions, patterning the conductive layer, and etching the conductive layer to leave a desired interconnect structure. Additional protective layers, vias, and conductive layers can similarly be formed if multiple interconnect layers are desired for the NVM array. Other variations could be implemented, as desired.

Next looking to FIGS. 5A-C, example cross-section views are shown for formation of the end cell wrap connection and associated contact landing region using a dummy select gate structure and a non-patterned spacer gate etch.

FIG. 5A is a cross-section view of an embodiment 500 after a select gate processing step. As depicted, select gate (SG) structure 510 has been formed over substrate 102 along with dielectric (e.g., oxide) layer 514. Using the same select gate processing steps, a dummy select gate (DSG) structure 512 and dielectric (e.g., oxide) layer 516 have also been formed while the select gate structure 510 and dielectric layer 514 were being formed. As such, the dummy select gate structure 512 is formed using the same material and processing steps as used to form the select gate structure 510. Further, protective layers 504 and 505 have been formed over the select gate 510 and dummy select gate structure 512.

FIG. 5B is a cross-section view of an embodiment 520 after a control gate layer 522 has been formed after formation of an intervening charge storage layer 518. As shown, the control gate layer 522 is formed over the previously formed select gate structure 510, dummy select gate structure 512, and charge storage layer 518. As also seen with respect to embodiment 520 and described herein, the dummy select gate structure 512 causes the control gate material to cover the dummy select gate structure 512 and to fill in the gap area between the dummy select gate structure 512 and the select gate structure 510. Without the dummy select gate structure 512, the control gate material would drop much closer to substrate 102 as indicated by dashed line 525 and would be significantly removed during the spacer etch of the control gate layer 522. It is again noted that the spacing of the dummy select gate structure 512 from the select gate structure 510 is dependent on the select gate and control gate material thicknesses. As one example, the distance from the edge of the dummy select gate structure 512 to the select gate structure 510 can be made to be equal to or less than about 1.5-2.0 times the thickness of the control gate layer. Other variations and dimensions could also be utilized, as desired, while still allowing the control gate material to fill in the gaps between select-gate structures and dummy select-gate structures.

FIG. 5C is a cross-section view of an embodiment 550 after control gate material in the control gate layer 522 has been etched. As depicted, control gate region 552 extends to the dummy select gate structure 510 and has remained after a non-patterned spacer gate etch has been used to form spacer control gates within the NVM cell array. Advantageously, an improved contact landing region that provides a more planar contact surface, as represented by arrow 570, is formed by the control gate region 552. As such, an electrical contact later made to the control gate material 552 will have a better electrical connection due to the improved contact landing region 570.

Now looking to FIGS. 6A-B and 7, example top views are shown for formation of the end cell wrap connection and associated contact landing region. It is again noted that these top view diagrams provide representative embodiments of only a portion of an NVM cell array and are not necessarily drawn to exact scale.

FIG. 6A is a top view diagram of an embodiment 600 of an end cell after an initial gate processing step for the formation of the control-gate wrap connection. Select gate (SG) lines 321, 322, 323, and 324 have been formed over the semiconductor substrate during a select gate processing step. Dummy select gate (DSG) structures 605, 606, and 607 represent dummy select gate structures that are also formed during the select gate processing step and are formed at the longitudinal ends of the select gate lines within the array of NVM cells. After the select gate processing step, a charge storage layer is formed, and then control gate (CG) material is deposited to form a control gate layer. After the control gate layer is formed, a non-patterned spacer etch is used to etch the control gate layer in order to form spacer control gates associated with the select gate lines 321, 322, 323, and 324. As shown, the control gate regions 610, 612, and 614 remain after the spacer etch, and contact landing regions are provided adjacent the dummy select gate structures 605, 606, and 607 where electrical contacts can be made, as shown in FIG. 6B. It is again noted that active line 307 represents one of numerous areas of the resulting NVM cell array where active split-gate cells will be formed using the select gate lines 321, 322, 323, and 324. It is further noted that several active lines at the edge of the array are typically used as dummy lines for process control. These are identified as dummy active lines 308 within end region 609.

FIG. 6B is a top view diagram of an embodiment 650 after parasitic (or redundant) control gates regions have been etched away and electrical contacts have been made. As depicted, portions of the control gate material 610, 612, and 614 in FIG. 6A between select gate lines 321 and 322 and between select gate lines 322 and 324 (i.e., redundant control gate regions) are etched using a patterned etch process step to leave control gate lines 662, 663, 664, and 665. Control gate region 661 provides an end cell wrap connection between control gate lines 663 and 664. Locations 652, 654, 656, and 658 represent example locations where contacts can be placed in later processing steps to form connections to the contact landing regions within the control-gate strap regions that have been formed using the dummy select gate structures 605, 606, and 607. Locations 332 and 334 represent locations where drain contacts can be placed in later processing steps to form connections to drain regions formed between select gate lines 321/322 and 323/324, respectively. Location 336 represents a location where a source contact can be placed in later processing steps to form a connection to source regions formed between control gate lines 312/314. It is again noted that the parasitic (or redundant) control gates regions could be left, if desired.

FIG. 7 is a top view diagram of an embodiment 700 where additional dummy select gate material is used to provide a larger contact landing region associated with the end cell wrap connection. As depicted, additional dummy select gate (DSG) structure 702 has been used to expand the control gate material associated with the end cell wrap connection between control gate lines 663 and 664. As such, the dummy select gate 702 provides for a larger resulting contact landing region, thereby allowing more flexibility for locating electrical contacts, such as at locations 704 and 706, as compared to locations 656 and 658 in FIG. 6B. Further, as with FIG. 6B, locations 332 and 334 represent locations where source contacts can be placed in later processing steps to form connections to source regions formed between select gate lines 321/322 and 323/324, respectively. Location 336 represents a location where a drain contact can be placed in later processing steps to form a connection to drain regions formed between control gate lines 312/314.

It is again noted that the improved contact landing regions described herein are formed at the same time that select gate structures and control gate structures are formed for active split-gate NVM cells (not shown) within the active regions 307 for the NVM cell array. As further described above, subsequent processing steps can be used to complete the split-gate NVM cells within the active regions 307. For example, after the control gates and select gates are patterned and etched to form desired structures within the active regions 307 (at which time the improved landing regions as also formed using the dummy select gate structures described herein), source/drain implants can be used to form source regions and drain regions for the active split-gate NVM cells within the active regions 307. Further, as described above, one or more subsequent processing steps can be utilized to place electrical contacts in desired locations and to form desired interconnections for the NVM array. For example, interconnect layers can be formed using one or more metal layers, doped polysilicon layers, and/or other desired conductive material layers, along with protective layers and vias, to create desired interconnect layers.

Looking now to FIG. 8, a process flow diagram is shown of an embodiment 800 for using dummy select gate structures and a non-patterned spacer etch to form improved contact landing regions for spacer control gate structures without adding additional masks, as described herein. In block 802, select gate structures and at least one dummy select gate structure are formed on a substrate along with a select-gate dielectric layer (e.g., oxide). In block 804, a charge storage layer is formed over the select gates, dummy select gate structure(s), and substrate. In block 806, a control gate layer is formed over the charge storage layer. In block 808, a non-patterned spacer etch is used to etch the control gate layer in order to form spacer control gate structures adjacent to select gate structures within split-gate NVM cells and simultaneously to form at least one contact landing region associated with dummy select gate structure(s). In block 810, after one or more intervening processing steps, such as for example, processing steps to remove the charge storage layer from the select gate surface and to form source/drain regions, one or more electrical contacts are made to the contact landing region(s). It is noted that the different and/or additional processing steps could also be utilized, if desired, in addition to those shown in FIG. 8. Further, as described above, patterning and etch processing steps can also be used to remove parasitic (or redundant) spacer control gate regions, if desired. Other variations could also be implemented, as desired, while still utilizing dummy select gate structures and a non-patterned spacer etch for a control gate layer to form improved contact landing regions.

FIG. 9 provides an example embodiment 900 for wordline driver and column driver connections associated with split-gate NVM cell 910 within an array of NVM cells. With respect to split-gate NVM cell 910, it is seen that a control-gate voltage ($V_{CG}$) is provide to the control gate for the NVM cell 910 through a connection 918 made between the control gate and the control-gate wordline 904. These control-gate wordline connections 918 are difficult to achieve with a standard spacer etch process without additional masking. As described herein, however, a dummy select gate structure and a spacer gate etch can be used to form a control-gate strap and an associated contact landing region between two adjacent control gate lines that are used to form split-gate NVM cells, as shown for example in FIGS. 3-4. An electrical contact made to this contact landing region can then be used to effectively provide control-gate connections 918 for NVM cells 910 within adjacent rows of NVM cells. As further depicted for embodiment 900, in addition to a connection 918 to the control-gate wordline 904 to provide the control-gate voltage ($V_{CG}$) to the control gate for the NVM cell 910, a select-gate voltage ($V_{SG}$) is provided to the select-gate for NVM cell 910 through connection 916 to a second select-gate wordline 902. Also, a source voltage ($V_S$) is provided to a source for NVM cell 910 through connection 914, which is shown as connected to ground 908 for embodiment 900. And a drain voltage ($V_D$) is provided to a drain for NVM cell 910 through connection 912 to the column bit-line 906. It is further noted that for an NVM system, the column bit-line 906 is coupled to column drivers, and the select-gate wordline 902 and the control-gate wordline 904 are coupled to wordline drivers. Other variations could be implemented, as desired.

As described herein, a variety of embodiments can be implemented and different features and variations can be implemented, as desired.

Embodiments are described herein for a method for forming a contact landing region for a split-gate non-volatile memory (NVM) system including forming select gate structures for split-gate non-volatile memory (NVM) cells within an array of split-gate NVM cells, forming a dummy select gate structure while forming the select gate structures, forming a charge storage layer for the split-gate NVM cells, forming a control gate layer over the select gate structures and the dummy select gate structure, and etching the control gate layer with a non-patterned spacer etch to form control gate structures associated with the split-gate NVM cells and to form a contact landing region between the select gate structure and the dummy select gate structure.

In further embodiments, the distance from an edge for the dummy select gate structure to an edge for a select gate structure is equal to or less than about 1.5 to 2.0 times the thickness of the control gate layer. Still further, the method can include forming an electrical contact coupled to the contact landing region. In addition, a plurality of dummy select gate structures can be formed, and the etching step can form a plurality of control gate structures and contact landing regions. The contact landing region can also include a sloped edge extending from the select gate structure and a sloped edge extending from the dummy select gate structure.

In additional embodiments, the dummy select gate structure is formed between two select gate lines within the array of NVM cells. Further, the etching step can leave a control-gate strap between the two select gate lines that includes the dummy select gate structure. In addition, the method can further include forming at least one select-gate tab while forming the select gate structures, the select-gat tab extending from a select gate structure towards the dummy select gate structure.

In still further embodiments, the dummy select gate structure can be formed at the longitudinal ends of two select gate lines within the array of NVM cells. Further, the etching step can leave a control-gate wrap connection adjacent the two select gate lines that includes the dummy select gate structure. In addition, the method can further include forming an additional dummy select gate structure between the two select gate lines while forming the select gate structures. Still further, the etching step can leave an additional contact landing region between the dummy select gate structure and the additional dummy select gate structure. Also, the etching step can further leave an additional contact landing region between the additional dummy select gate structure and the select gate structure.

Embodiments are also disclosed herein for a split-gate non-volatile memory (NVM) cell array including select gate structures formed using a first material layer, dummy select gate structures also formed using the first material layer, control gate structures formed using a second material layer and a non-patterned spacer etch, charge storage layers associated with the select gate structures and the control gate structures, contact landing regions between the dummy select gate structures and the select gate structures where the contact landing regions have been formed using the second material layer and the non-patterned spacer gate etch used to form the control gate structures. Further, electrical contacts can be coupled to the contact landing regions.

In further embodiments, the first material layer and the second material layer include doped polysilicon. Still further, for each dummy select gate structure, a distance from an edge for the dummy select gate structure to an edge for a select gate structure is equal to or less than about 1.5 to 2.0 times the thickness of the control gate layer. In addition, the contact landing regions can include sloped edges extending from select gate structures and sloped edges extending from dummy select gate structures.

In additional embodiments, at least one dummy select gate structure can be located between two select gate lines for the split-gate NVM cell array. Further, at least one contact landing region can be associated with a control-gate strap between the two select gate lines, the control-gate strap including the dummy select gate structure. Still further, at least one select gate tab can be associated with the dummy select gate structure where the select-gat tab extends from the a select gate structure towards a dummy select gate structure and comprising the first material.

In still further embodiments, at least one dummy select gate structure can be located at the longitudinal ends of two select gate lines within the split-gate NVM cell array. Further, at least one contact landing region can be associated with a control-gate wrap connection adjacent the two select gate lines, the wrap connection including the dummy select gate structure. Still further, at least one additional dummy select gate structure can be located between the two select gate lines. Also, at least one contact landing region can be associated with the additional dummy select gate structure.

Unless stated otherwise, terms such as "first" and "second" are used to arbitrarily distinguish between the elements such terms describe. Thus, these terms are not necessarily intended to indicate temporal or other prioritization of such elements.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the invention is described herein with reference to specific embodiments, various modifications and changes can be made without departing from the scope of the present invention. Accordingly, the specification and figures are to be regarded in an illustrative rather than a restrictive sense, and such modifications are intended to be included within the scope of the present invention. Further, any benefits, advantages, or solutions to problems that are described herein with regard to specific embodiments are not intended to be construed as a critical, required, or essential feature or element of any or all the claims.

What is claimed is:

1. A split-gate non-volatile memory (NVM) cell array, comprising:
    select gate structures for a plurality of split-gate NVM cells within the split-gate NVM cell array formed using a first material layer;
    dummy select gate structures also formed using the first material layer;
    control gate structures for the plurality of split-gate NVM cells formed using a second material layer and a non-patterned spacer etch;
    charge storage layers for the plurality of split-gate NVM cells associated with the select gate structures and the control gate structures;
    contact landing regions between the dummy select gate structures and the select gate structures, the contact landing regions being formed using the second material layer and the non-patterned spacer gate etch used to form the control gate structures; and
    electrical contacts coupled to the contact landing regions;
    wherein each of the plurality of split-gate NVM cells comprises one of the charge storage layers formed between one of the select gate structures and one of the control gate structures.

2. The split-gate NVM cell array of claim 1, wherein the first material layer and the second material layer comprises doped polysilicon.

3. The split-gate NVM cell array of claim 1, wherein at least one dummy select gate structure is located between two select gate lines for the split-gate NVM cell array.

4. The split-gate NVM cell array of claim 1, wherein at least one dummy select gate structure is located at longitudinal ends of two select gate lines within the split-gate NVM cell array.

5. The split-gate NVM cell array of claim 4, further comprising at least one additional dummy select gate structure located between the two select gate lines.

6. The split-gate NVM cell array of claim 5, wherein at least one contact landing region is associated with the additional dummy select gate structure.

7. A split-gate non-volatile memory (NVM) cell array, comprising:
    select gate structures formed using a first material layer;
    dummy select gate structures also formed using the first material layer;
    control gate structures formed using a second material layer and a non-patterned spacer etch;
    charge storage layers associated with the select gate structures and the control gate structures;
    contact landing regions between the dummy select gate structures and the select gate structures, the contact landing regions being formed using the second material layer and the non-patterned spacer gate etch used to form the control gate structures; and electrical contacts coupled to the contact landing regions;

wherein at least one dummy select gate structure is located between two select gate lines for the split-gate NVM cell array; and wherein at least one contact landing region is associated with a control-gate strap between the two select gate lines, the control-gate strap including the at least one dummy select gate structure.

8. A split-gate non-volatile memory (NVM) cell array, comprising:

select gate structures formed using a first material layer;

dummy select gate structures also formed using the first material layer;

control gate structures formed using a second material layer and a non-patterned spacer etch;

charge storage layers associated with the select gate structures and the control gate structures;

contact landing regions between the dummy select gate structures and the select gate structures, the contact landing regions being formed using the second material layer and the non-patterned spacer gate etch used to form the control gate structures; and electrical contacts coupled to the contact landing regions;

wherein at least one dummy select gate structure is located between two select gate lines for the split-gate NVM cell array; and further comprising at least one select gate tab associated with the dummy select gate structure, the select-gat tab extending from the at least one select gate structure towards a dummy select gate structure and comprising the first material.

9. A split-gate non-volatile memory (NVM) cell array, comprising:

select gate structures formed using a first material layer;

dummy select gate structures also formed using the first material layer;

control gate structures formed using a second material layer and a non-patterned spacer etch;

charge storage layers associated with the select gate structures and the control gate structures;

contact landing regions between the dummy select gate structures and the select gate structures, the contact landing regions being formed using the second material layer and the non-patterned spacer gate etch used to form the control gate structures; and electrical contacts coupled to the contact landing regions;

wherein at least one dummy select gate structure is located at longitudinal ends of two select gate lines within the split-gate NVM cell array; and wherein at least one contact landing region is associated with a control-gate wrap connection adjacent the two select gate lines, the wrap connection including the at least one dummy select gate structure.

10. A split-gate non-volatile memory (NVM) cell array, comprising:

select gate structures formed using a first material layer;

dummy select gate structures also formed using the first material layer;

control gate structures formed using a second material layer and a non-patterned spacer etch;

charge storage layers associated with the select gate structures and the control gate structures;

contact landing regions between the dummy select gate structures and the select gate structures, the contact landing regions being formed using the second material layer and the non-patterned spacer gate etch used to form the control gate structures; and electrical contacts coupled to the contact landing regions;

wherein the contact landing regions comprise sloped edges extending from select gate structures and sloped edges extending from dummy select gate structures.

11. A split-gate non-volatile memory (NVM) cell array, comprising:

select gate structures formed using a first material layer;

dummy select gate structures also formed using the first material layer;

control gate structures formed using a second material layer and a non-patterned spacer etch;

charge storage layers associated with the select gate structures and the control gate structures;

contact landing regions between the dummy select gate structures and the select gate structures, the contact landing regions being formed using the second material layer and the non-patterned spacer gate etch used to form the control gate structures; and electrical contacts coupled to the contact landing regions;

wherein for each dummy select gate structure, a distance from an edge for the dummy select gate structure to an edge for a select gate structure is equal to or less than about 1.5 to 2.0 times the thickness of the control gate layer.

\* \* \* \* \*